United States Patent
Tabara et al.

[11] Patent Number: 6,147,003
[45] Date of Patent: Nov. 14, 2000

[54] METHOD OF MANUFACTURING SEMICONDUCTOR DEVICE

[75] Inventors: Suguru Tabara; Hiroshi Naito, both of Hamamatsu, Japan

[73] Assignee: Yamaha Corporation, Japan

[21] Appl. No.: 09/072,799

[22] Filed: May 5, 1998

[30] Foreign Application Priority Data

May 6, 1997 [JP] Japan ................................. 9-115877

[51] Int. Cl.[7] ............................................. H01L 21/302
[52] U.S. Cl. ...................... 438/704; 438/710; 438/723; 438/725; 438/906
[58] Field of Search ................................. 438/684, 704, 438/723, 734, 756, 710, 725, 906

[56] References Cited

U.S. PATENT DOCUMENTS

| | | | |
|---|---|---|---|
| 5,399,527 | 3/1995 | Tabara | 438/625 |
| 5,451,291 | 9/1995 | Park et al. | 156/644.1 |
| 5,554,254 | 9/1996 | Huang et al. | 438/643 |
| 5,670,019 | 9/1997 | Huang | 156/643.1 |
| 5,872,053 | 2/1999 | Smith | 438/626 |

FOREIGN PATENT DOCUMENTS

| | | |
|---|---|---|
| 6-37188 | 2/1994 | Japan . |
| 6-77178 | 3/1994 | Japan . |
| 7-99188 | 4/1995 | Japan . |

*Primary Examiner*—Felisa Hiteshew
*Assistant Examiner*—Donald L. Champagne
*Attorney, Agent, or Firm*—Ostrolenk, Faber, Gerb & Soffen, LLP

[57] ABSTRACT

A method of manufacturing a semiconductor device includes the steps of: a) forming a wiring layer on a semiconductor substrate, the wiring layer being an Al or Al alloy layer, or a laminated wiring layer including an Al or Al alloy layer and a Ti or Ti alloy layer formed thereon; b) coating a resist layer on the wringing layer and patterning the resist layer to form a wiring resist pattern; c) patterning the wiring layer to form a wiring pattern 3 by using the wiring resist pattern as a mask; d) forming an interlayer insulating film 5 on the semiconductor substrate to cover the wiring pattern; e) coating a resist layer on the interlayer insulating film and patterning the resist layer to form a connection hole resist pattern 6; f) dry-etching the interlayer insulating film with an etching gas containing fluorine to form a connection hole reaching the wiring pattern 3, by using the connection hole resist pattern as a mask; g) after the step f), rinsing the semiconductor substrate in a liquid 10 made of a material selected from a group consisting of water, alcohol, pyridine, and combinations thereof; and h) after the step g), ashing the connection hole resist pattern 6.

17 Claims, 6 Drawing Sheets

METHOD OF MANUFACTURING SEMICONDUCTOR DEVICE

This application is based on Japanese Patent Application No. 9-115877 filed on May 6, 1997.

BACKGROUND OF THE INVENTION a) Field of the Invention

The present invention relates to a method of manufacturing a semiconductor device, and more particularly to a method of manufacturing a semiconductor device including a dry-etching process for forming a connection (contact) hole through an insulating film.

b) Description of the Related Art

In a semiconductor device having a multi-layer wiring structure, insulation between wiring layers is made by an interlayer insulating film. In order to form electrical connection between the wiring layers, a connection (contact) hole is formed through the interlayer insulating film by using a resist pattern. Anisotropic etching or a combination of isotropic etching and anisotropic etching is performed to retain a high patterning precision. For anisotropic etching of an interlayer insulating film, fluorine containing etching gas is used such as $CF_4$, $CHF_3$, $C_2F_6$, $C_3F_8$, and $C_4F_8$. After the connection hole is formed, the resist pattern is removed.

A residue called a crown may be left in a connection hole after the connection hole forming process. If the succeeding process is performed with the crown being left in the connection hole, a manufacture yield and reliability may be lowered. Various methods have been proposed to remove a crown.

A method proposed in JP-A-6-37188 ashes (half-ashes) a portion of resist on an aluminum wiring layer and thereafter removes the remaining resist and crown at the same time by using fuming nitric acid.

However, if this method is used for ashing resist on a laminated wiring structure including an aluminum or aluminum alloy layer and a cap layer made of Ti compound or the like formed on the aluminum or aluminum alloy layer, the cap layer is removed by nitric acid.

JP-A-6-77178 proposes a method of manufacturing a semiconductor device having an aluminum alloy layer and a TiON antireflection layer laminated on the aluminum alloy layer, capable of facilitating to remove a crown.

With this method, in forming a connection hole through an interlayer insulating film to an aluminum alloy layer, by using a resist pattern, etching is temporarily stopped when the connection hole is formed to an intermediate depth of the insulating film. After the side wall of the resist pattern is retracted through ashing with oxygen plasma, the etching is again performed. Since a re-deposition layer formed on the side walls of the resist pattern and connection hole can be separated, it becomes easy to remove the re-deposition layer by nitric acid or the like.

However, since the side wall of the resist pattern is retracted during the etching process, the etching precision lowers. Even if the TiON antireflection film on the aluminum alloy layer is to be left, the TiON antireflection film may be removed while the re-deposition layer is removed with nitric acid. This problem also occurs if a cap layer of Ti compound is formed on an aluminum alloy layer.

A method proposed in JP-A-7-99188 etches an interlayer insulating film by adding nitrogen to a gas not containing $O_2$ to form a connection hole through the interlayer insulating film to an aluminum alloy layer.

Even if aluminum is sputtered and re-deposited on the side wall of a resist pattern, the re-deposition layer can be prevented from being cured. After etching, nitric acid rinsing and water rinsing are performed.

However, if this method is used for a wiring structure including an aluminum alloy layer and a cap layer of Ti alloy formed thereon, the cap layer may be removed by nitric acid.

As described above, if a crown formed when a connection hole is etched through an insulating layer to a wiring layer, is removed by using conventional techniques, the wiring layer is likely to be affected.

SUMMARY OF THE INVENTION

It is an object of the present invention to provide a method of manufacturing a semiconductor device, capable of efficiently removing a crown without affecting a wiring layer.

According to one aspect of the present invention, a method of manufacturing a semiconductor device includes the steps of: a) forming a wiring layer on a semiconductor substrate, the wiring layer being an Al or Al alloy layer, or a laminated wiring layer including an Al or Al alloy layer and a Ti or Ti alloy layer formed thereon; b) coating a resist layer on the wringing layer and patterning the resist layer to form a wiring resist pattern; c) patterning the wiring layer to form a wiring pattern by using the wiring resist pattern as a mask; d) forming an interlayer insulating film on the semiconductor substrate to cover the wiring pattern; e) coating a resist layer on the interlayer insulating film and patterning the resist layer to form a connection hole resist pattern; f) dry-etching the interlayer insulating film with an etching gas containing fluorine to form a connection hole reaching the wiring pattern, by using the connection hole resist pattern as a mask; g) after the step f), rinsing the semiconductor substrate in a liquid made of a material selected from a group consisting of water, alcohol, pyridine, and combinations thereof; and h) after the step g), ashing the connection hole resist pattern.

A crown is considered to be generated from depositions of fluoride of Al and Ti which are sputtered from the wiring layer surface when the wiring layer is over-etched after the contact hole is formed through the interlayer insulating film to the wiring layer. If these depositions are oxidized during resist ashing, they become stable and form-unidentified oxide which is hard to be removed.

Al fluoride $AlF_3$ is soluble in water and has a solubility of 0.559 g per 100 ml in water at 25° C. Ti fluoride $TiF_4$ is known to be soluble and decomposable in water, pyridine, alcohol and sulfuric acid. If water is used, however, it is preferable to use water cooled to a room temperature or lower.

If $AlF_3$ and $TiF_4$ are dissolved and removed from the connection hole side wall before they are oxidized during ashing, it is expected that generation of a crown can be prevented.

As above, according to the present invention, residues which may be formed by a process of etching an interlayer insulating film can be efficiently removed with less affecting the wiring layer.

DETAILED DESCRIPTION OF THE PREFERRED EMBODIMENTS

Embodiments of the invention will be described with reference to the accompanying drawings.

Figure 1A:
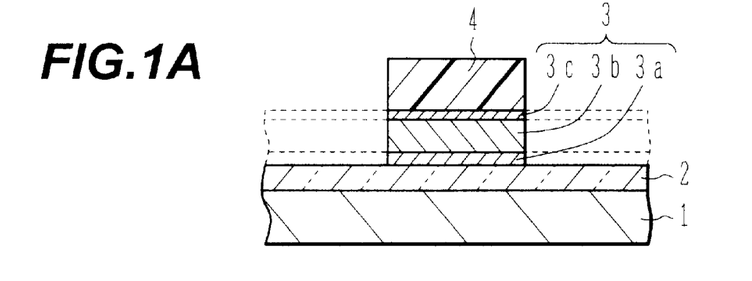
FIGS. 1A to 1H are schematic cross sectional views of a semiconductor wafer illustrating a semiconductor device manufacture method according to an embodiment of the invention.

As shown in FIG. 1A, on the surface of a Si substrate 1, an insulating film 2 is formed. The insulating film 2 may be a field oxide film or an interlayer insulating film which is formed covering the surface of the Si substrate after circuit components such as transistors are formed in the surface layer of the Si substrate 1. The insulating film 2 is made of, for example, $SiO_2$.

A wiring layer 3 is deposited on the surface of the insulating film 2, the wiring layer 3 being a lamination of a TiN film 3a, an Al alloy layer 3b, and a TiN layer or TiW layer 3c. The Al alloy may be Al—Si, Al—Cu, Al—Si—Cu or the like. Al alloy may be replaced by Al. In place of the TiN film, another Ti alloy film such as TiW or a Ti film may be used.

A resist film such as novolak resist is coated on the wiring layer 3, selectively exposed and developed to form a resist pattern 4. By using the resist pattern 4 as an etching mask, the underlying wiring layer 3 is anisotropically etched. The wiring layer 3 may be etched by using, for example, an inductively coupled plasma etching system.

Figure 2:
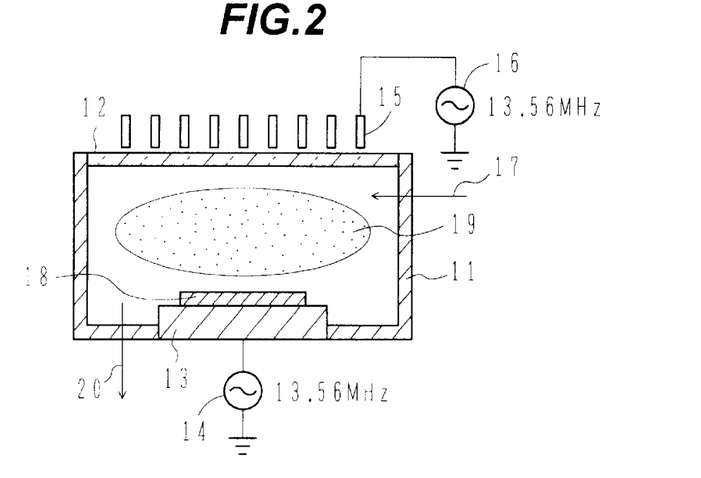
FIG. 2 is a schematic cross sectional view of an inductively coupled plasma etching system used with the embodiment method of the invention.

FIG. 2 shows an example of the structure of an inductively coupled plasma etching system. An etching chamber 11 has at its upper portion a dielectric window plate 12, and at its lower portion a bottom electrode 13 which is used as a susceptor of a wafer. The etching chamber 11 including the dielectric window plate 12 and bottom electrode 13 constitutes a hermetically sealed container capable of being evacuated. A radio frequency (RF) power at 13.56 MHz is supplied from an RF power source 14 to the bottom electrode 13.

An induction coil 15 is disposed above the dielectric window plate 12, the coil 15 being connected to another RF power source 16 which supplies an RF power at 13.56 MHz to the induction coil 15.

Etching gas such as chlorine containing gas is introduced via a gas inlet port 17 into the etching chamber 11 and discharged from a gas outlet port 20 so that the inside of the etching chamber 11 is maintained to have an etching gas atmosphere at a proper pressure. While the etching gas is introduced, RF power is supplied to the etching chamber 11 to generate plasma 19.

For example, dry-etching is performed by using etching gas of $Cl_2/BCl_3/CHF_3$ (flow rate: 50/40/5 sccm), by maintaining the pressure in the chamber at 10 mTorr, and by supplying RF power of 350 W to the induction coil 15 and RF power of 130 W to the bottom electrode 13.

With such dry-etching, the wiring layer 3 is anisotropically dry-etched conformal to the resist pattern 4 as shown in FIG. 1A. Instead of the inductively coupled plasma etching system, dry-etching may be performed by using, for example, a diode parallel plate type plasma etching system. The resist pattern 14 is thereafter removed.

Figure 1B:
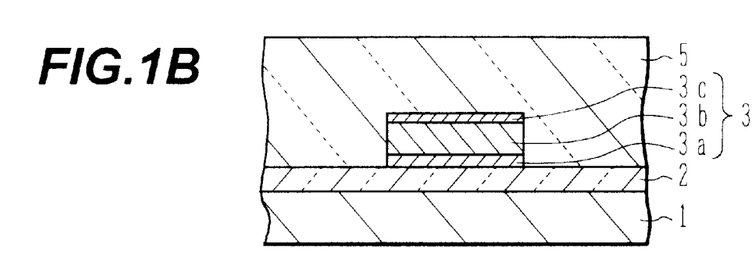

As shown in FIG. 1B, an interlayer insulating film 5 is deposited on the surface of the Si substrate 1, covering the patterned wiring layer 3. For example, by using tetraethoxysilane (TEOS) as etching gas, a TEOS oxide film is deposited 500 nm in thickness by plasma CVD. The TEOS oxide film provides a planarizing function and has a more flat surface than the wiring pattern 3. The interlayer insulating film may be other types of oxide films or oxynitride films, other insulating films, or laminations of a plurality of insulating films.

Figure 1C:
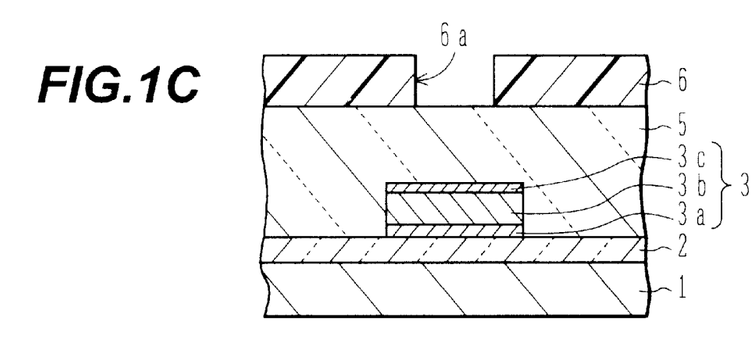

As shown in FIG. 1C, a resist film is coated on the surface of the interlayer insulating film 5, selectively exposed and developed to form a resist pattern 6. The resist pattern 6 has an opening 6a in an area corresponding to the wiring layer 3, the opening 6a being used later for forming a contact hole.

Figure 1D:
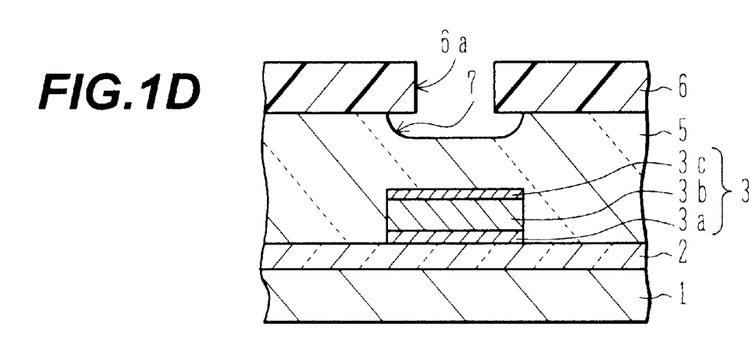

As shown in FIG. 1D, by using the resist pattern 6 as an etching mask, the interlayer insulating film 5 is isotropically etched to a desired depth by using buffered HF (BHF). As the interlayer insulating film under the opening 6a of the resist pattern 6 is etched, the interlayer insulating film 5 under the resist pattern 6 is also side-etched through isotropic etching. A cross section 7 having a wine glass shape is therefore obtained. The etching amount of this initial etching is, for example, 200 nm to 400 nm in depth.

Figure 1E:
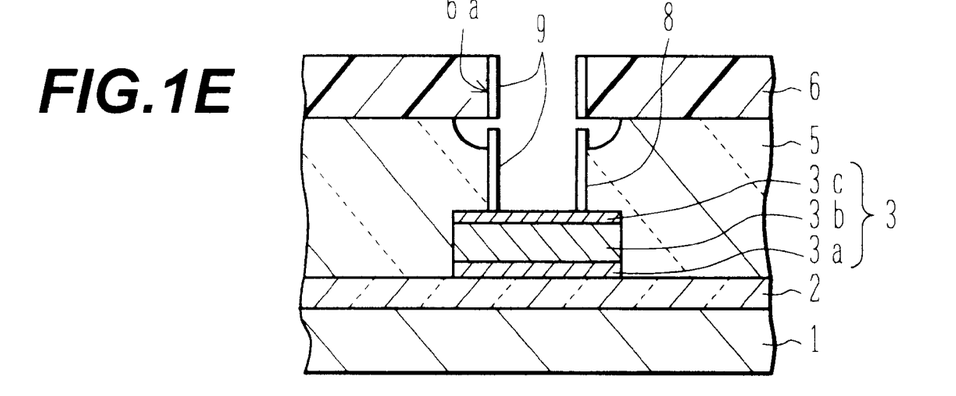

As shown in FIG. 1E, after the isotropic etching, the interlayer insulating film 5 is anisotropically dry-etched to form a connection hole 8 having generally a vertical side wall under the wine-glass shaped cross section 7. The contact hole 8 is etched conformal to the shape of the opening 6a of the resist pattern 6 until the underlying wiring layer 3 is exposed.

This anisotropic etching is performed by dry-etching with fluorine containing gas such as $CH_2F_2$, $CF_4+CHF_3$, $C_2F_6$, $C_3F_8$, $C_4F_8$ and combinations thereof. Dry-etching the interlayer insulating film 5 also etches the wiring layer 3 after it is exposed.

Figure 3A:
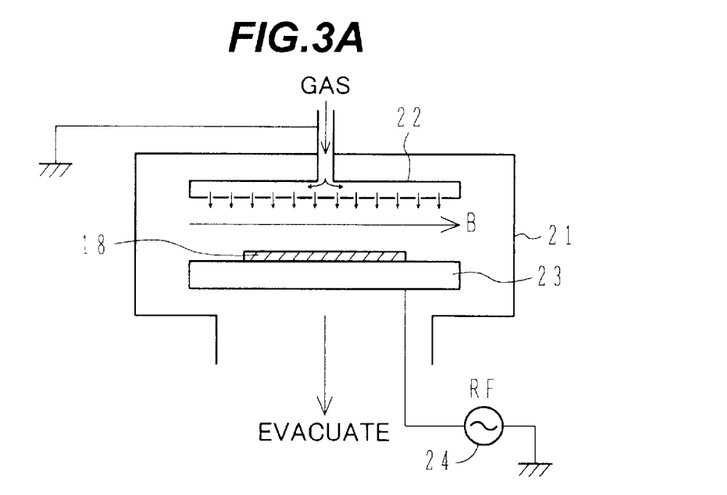
FIGS. 3A and 3B are a schematic cross sectional view showing the structure of a magnetron RIE system used with the embodiment method of the invention and a schematic perspective view of magnets.

FIG. 3A is a schematic diagram showing the structure of a magnetron reactive ion etching (RIE) system which is one example of etching systems for anisotropically etching an interlayer insulating film. As shown in FIG. 3A, an upper electrode 22 is disposed at the upper portion of an etching chamber 21, the upper electrode 22 having a number of gas blow openings. For example, the upper electrode 22 is electrically grounded. A lower electrode 23 is disposed at the lower portion of the etching chamber 21, facing the upper electrode 22. The lower electrode 23 is connected to an RF power source 24 at 13.56 MHz.

A gas drain port is formed in the lower wall of the etching chamber 21 and coupled to an evacuation system. A semiconductor wafer 18 to be etched is placed on the lower electrode 23. A magnetic field B is applied along a direction parallel to the surface of the lower electrode 23.

Figure 3B:
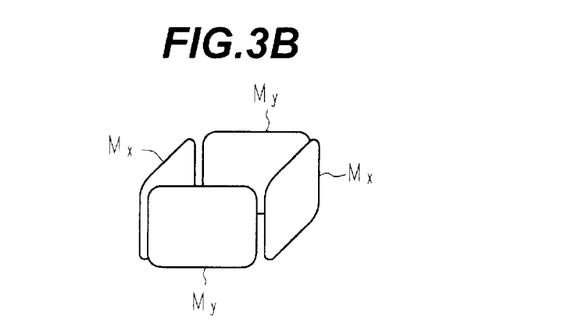

FIG. 3B shows an example of the structure for generating the magnetic field B. With this structure shown in FIG. 3B, X-axis magnets Mx for generating a magnetic field along an X-direction and Y-axis magnets My for generating a magnetic field along a Y-axis are disposed. The magnets Mx and My may be permanent magnets or electromagnets.

For example, the anisotropic etching of the contact hole through the interlayer insulating film is performed under the conditions that $CF_4/CHF_3/Ar$ (flow rate: 5/30/60 sccm) is used as etching gas, the pressure in the chamber is maintained at 200 mTorr, an RF power of 700 W is supplied to the lower electrode, and the magnetic flux density B is set to 30 Gauss.

As shown in FIG. 1E, the interlayer insulating film 5 is etched until the surface of the wiring layer 3 is exposed, and is further over-etched to stably etch all the desired regions. Then, however, the surface of the wiring layer 3 is sputtered to form a side wall protective film 9 containing $TiF_4$, $AlF_3$ or the like on the side wall of the contact hole 8. Although this side wall protective film is effective for anisotropic etching, it becomes difficult to remove the side wall protective film if it is oxidized because it changes to stable compound. Therefore, this film may form a crown.

Figure 1F:
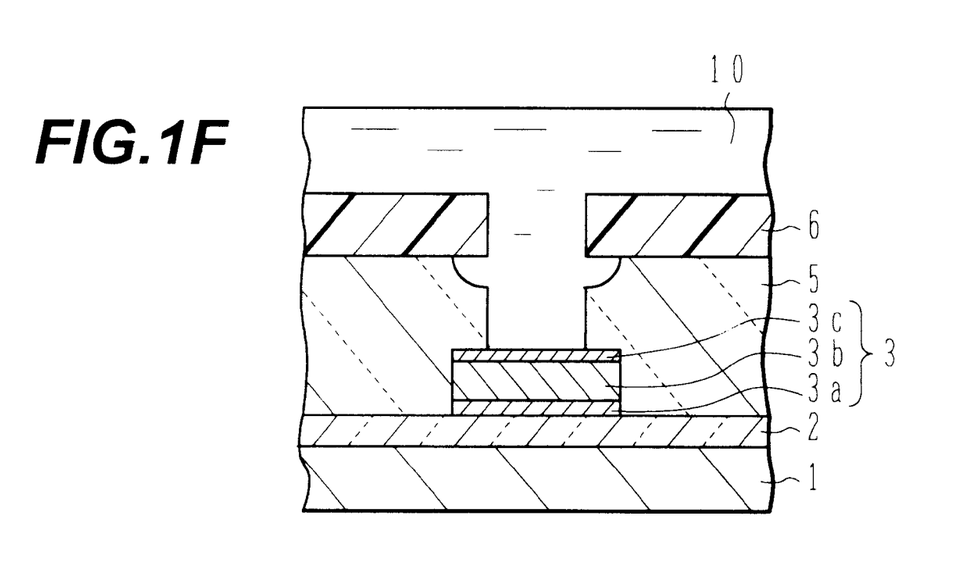

As shown in FIG. 1F, the semiconductor wafer is dipped in water 10 to rinse it. The temperature of the water is preferably lower than the room temperature (25° C.). If ultrasonic rinsing is performed by applying ultrasonic vibrations to the water 10, the cleaning effects are improved further. $TiF_4$ and $AlF_3$ are soluble or decomposable in water so that the side wall protective film 9 is removed through water rinsing.

This water rinsing process is preferably performed immediately after the etching process. It is more preferable to perform the water rinsing without exposing the etched wafer to the external atmosphere.

In order to remove $TiF_4$, alcohol or pyridine may be used in place of water. Alcohol may be methyl alcohol ($CH_3OH$), ethyl alcohol ($C_2H_5OH$), isopropyl alcohol $\{CH_3CH(OH)CH_3\}$ or the like. Pyridine may be pyridine ($C_5H_5N$), picoline (methylpyridine: $C_6H_7N$), lutidine (dimethylpyridine: $C_7H_9N$), collidine (ethylmethylpyridine: $C_8H_{11}N$), ethylpyridine, trimethylpyridine, propylpyridine, tetramethylpyridine or the like.

A combination of water rinsing and rinsing with either alcohol or pyridine is expected to remove more effectively the side wall protective film. Rinsing may also be performed by using water mixed with either alcohol or pyridine.

After the side wall protective film is removed, the semiconductor wafer is transported to an asher to remove the resist pattern through ashing with oxygen plasma.

Figure 4:
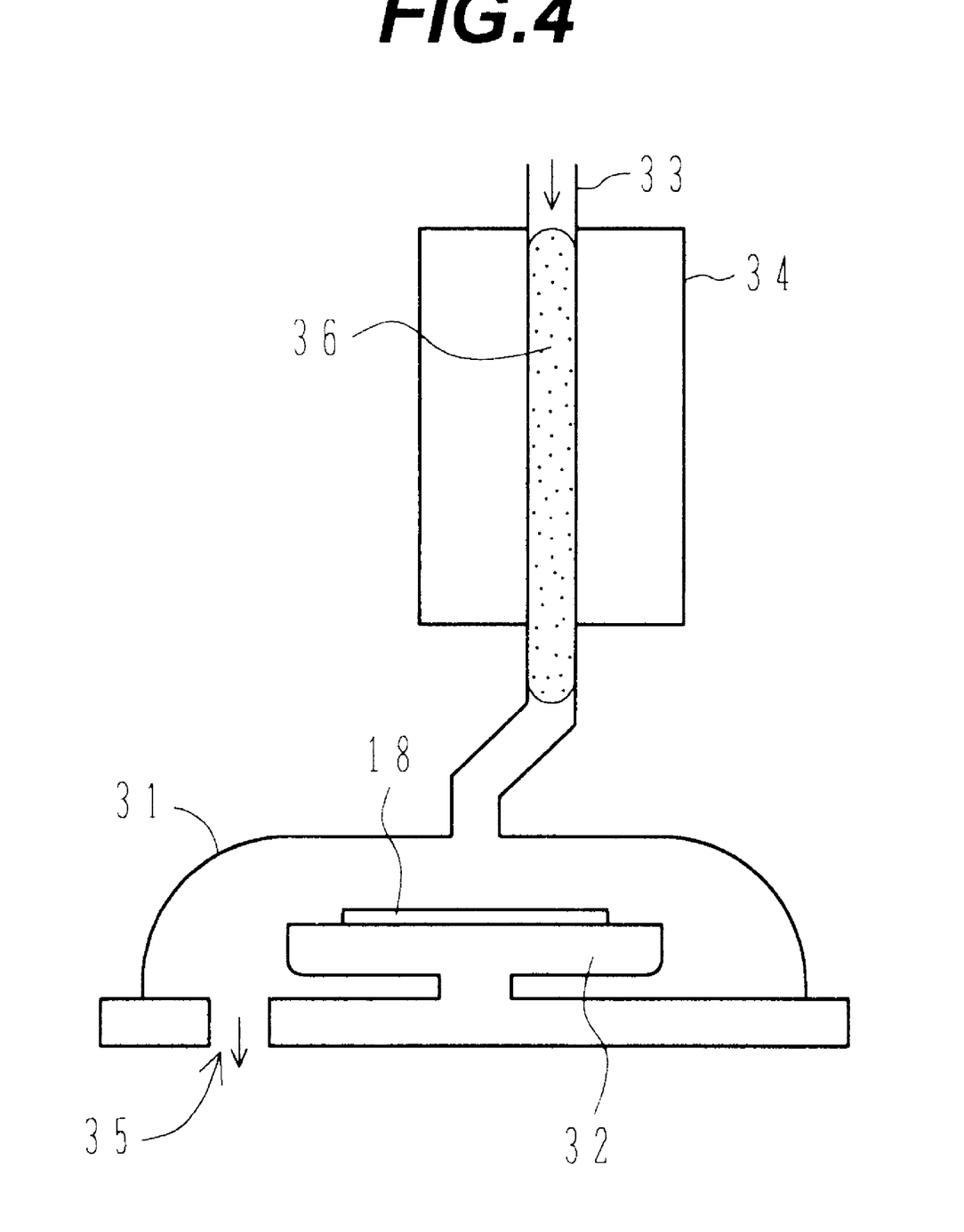
FIG. 4 is a schematic cross sectional view showing the structure of a microwave ashing system used with the embodiment method.

FIG. 4 is a schematic diagram showing an example of the structure of an asher. A wafer chuck 32 is disposed in a vacuum chamber 31. A semiconductor wafer 18 is placed on the chuck 31. Gas discharge holes 35 are formed in axial symmetry with the center axis of the chuck 32 in the wall of the vacuum chamber 31.

A gas pipe 33 made of quartz or the like is connected to the top of the vacuum chamber 31 in order to introduce oxygen containing gas into the vacuum chamber 31. A partial region of the gas pipe 33 is coupled to a microwave cavity 34. Plasma 36 is generated by microwaves locally in the gas pipe 33 surrounded by the microwave cavity 34.

For example, the resist pattern 6 is ashed for 60 seconds under the conditions of 400 W of a microwave power, 6 slm of an $O_2$ flow, 0.51 slm of an $N_2O$ flow, 4 Torr of a pressure, and 240° C. of a wafer chuck 32 temperature.

Figure 1G:
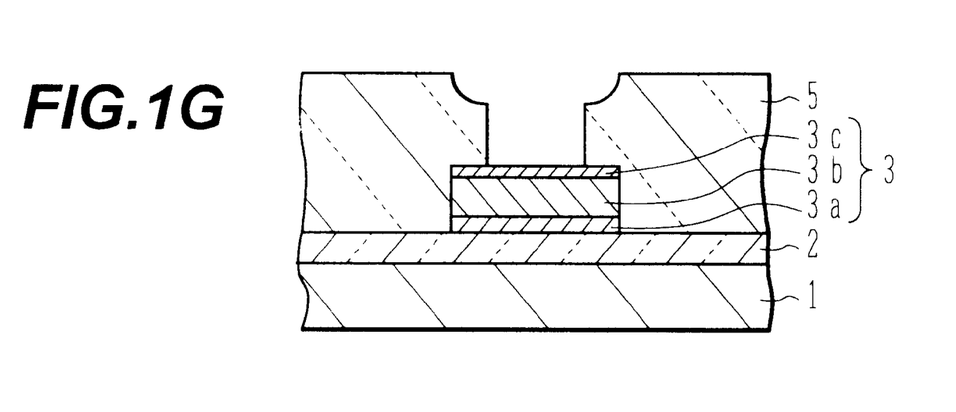

FIG. 1G shows the structure of the semiconductor wafer after the resist pattern is ashed in the above manner. It is preferable to rinse the wafer with resist removal liquid after the ashing. For example, rinsing with amine containing organic solvent is performed. Amine containing organic solvent may be a mixed solution of monoethanolamine and dimethyl sulfoxide.

Figure 1H:
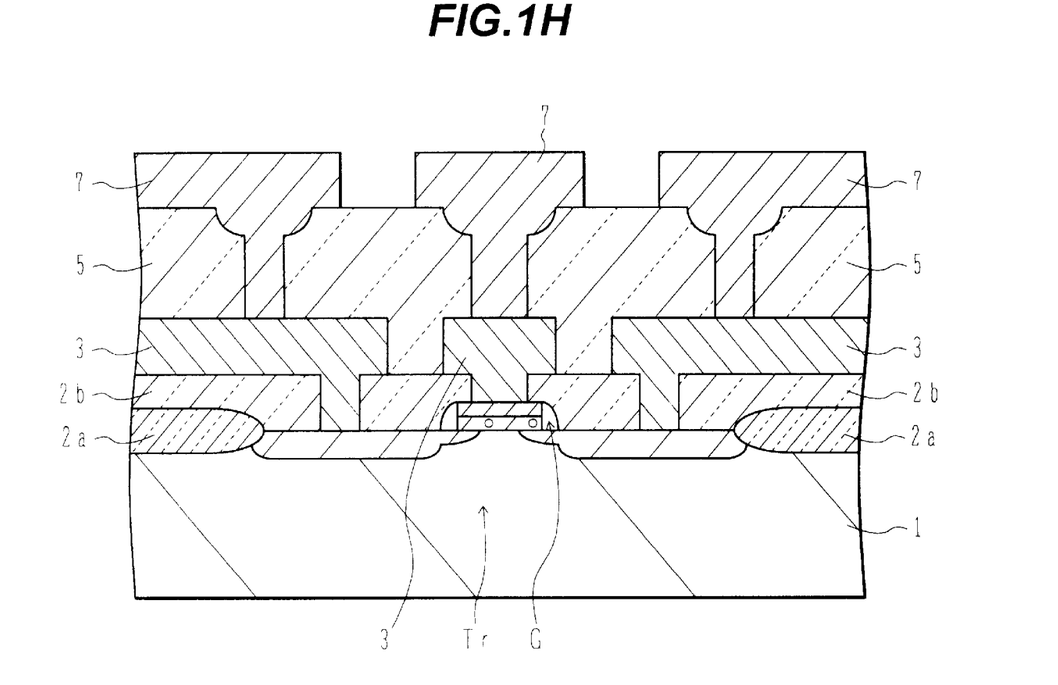

FIG. 1H shows an example of a more concrete structure of a semiconductor device. A transistor Tr having a gate G formed of a polysilicon layer and a suicide layer is formed in the substrate 1. Lower wiring patterns 3, each formed of a lamination of a TiN layer 3a, an Al alloy layer 3b, and a TiN or TiW layer 3c, are connected to the source/drain regions and the gate G of the transistor Tr, through an oxide film 2a, 2b. Another oxide film 5 covers the lower wiring patterns 3. Connection holes are formed through the oxide film 5 to the lower wiring patterns 3. Higher wiring patterns 7 are connected to the lower wiring patterns 3.

In the above embodiment, although a connection hole having a wine-glass shape is formed, a connection hole having generally the vertical side wall over the whole depth of the interlayer insulating film 5 may be formed by using only anisotropic etching. A connection or contact hole having a slanted side wall may also be formed.

Thereafter, an upper level wiring layer is deposited and patterned by a similar process described with FIG. 1A to form an upper wiring pattern as shown by 7. An insulating film is formed covering the upper wiring pattern. A contact hole forming process, an upper wiring layer pattern forming process, and an insulating layer forming process are repeated as many times as necessary.

Figure 5A:
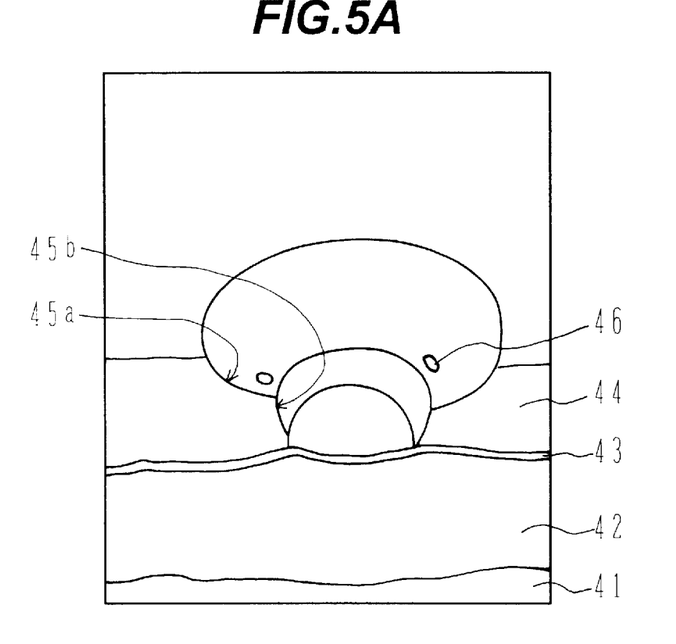
FIGS. 5A and 5B are sketches showing the surfaces of contact holes formed by conventional techniques and by the embodiment method.
Figure 5B:
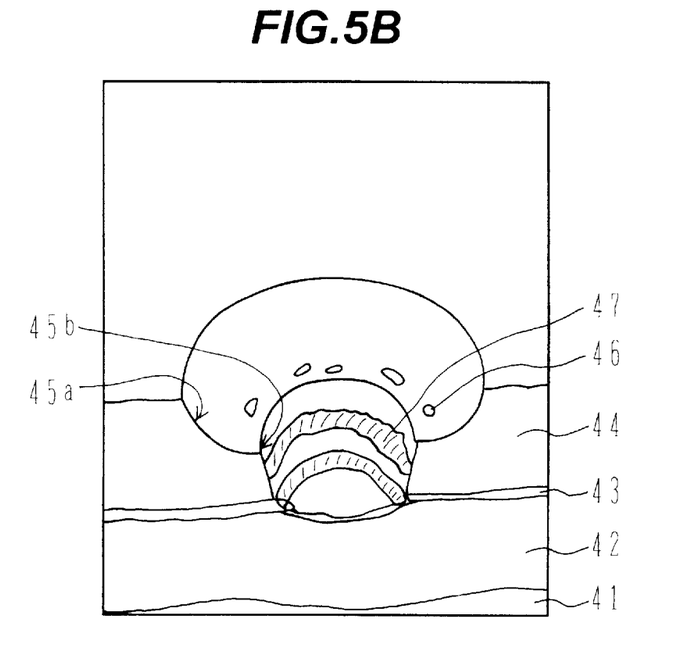

FIGS. 5A and 5B are sketches showing the surfaces of contact holes formed by conventional techniques and by the embodiment method.

FIG. 5A is a sketch showing the surface of a contact hole formed by anisotropic dry-etching of the contact hole, water rinsing, ashing, and resist removal liquid rinsing. FIG. 5B is a sketch showing the surface of a contact hole formed by dry-etching of the contact hole, ashing and resist removal liquid rinsing, without using water rinsing after dry-etching.

In both the samples shown in FIGS. 5A and 5B, on an underlying layer 41, an Al—Si—Cu alloy layer 42 and a TiN layer 43 were deposited, and on the TiN layer 43 a TEOS oxide film 44 as an interlayer insulating film was formed. The connection hole having a wine-glass shape 45a and generally the vertical side wall 45b was formed by etching the interlayer insulating film 44.

In the sample formed by conventional techniques shown in FIG. 5B, a crown 47 was formed on generally the vertical side wall 45b and residue depositions 46 were observed on the wineglass portion. In contrast with this, in the sample formed by the embodiment method shown in FIG. 5A, although some residues 46 were observed, a crown surrounding the side wall of the contact hole was not formed.

It has been found that water rinsing before the ashing as in the above embodiment method considerably reduces residues which are by-products of etching. A combination of water rinsing and rinsing with alcohol or pyridine is expected to be more efficient.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising:
   a) providing a laminated conductive structure on a substrate, the laminated conductive structure including a first conductive sub-layer, a second conductive sub-layer formed on the first conductive sub-layer, and a third conductive sub-layer which is formed on the second conductive sub-layer and is made of a material selected from a group consisting of titanium and titanium compound;
   b) forming an insulating layer over the laminated conductive structure;

c) etching the insulating layer through a mask pattern to provide a hole therein until the third conductive sub-layer is exposed, the etching including forming a fluoride on a side wall of the hole;

d) rinsing the substrate in a liquid made of a material selected from the group consisting of water, alcohol, pyridine, and combinations thereof to remove the fluoride formed on the side wall of the hole; and e) removing the mask pattern from the substrate in a plasma after said step d).

2. The method according to claim 1, wherein the etching is performed with a gas including fluorine.

3. The method according to claim 1, wherein the etching is performed through a resist mask pattern.

4. The method according to claim 1, wherein said rinsing includes rinsing the substrate in the liquid by applying ultrasonic vibrations to the liquid.

5. The method according to claim 1, wherein said rinsing uses water cooled to a room temperature or lower.

6. The method according to claim 1, wherein said etching includes performing isotropic etching and thereafter performing anisotropic etching.

7. The method according to claim 1, wherein the gas including fluorine is a gas made of a material selected from the group consisting of $CH_2F_2$, $CF_4$, $CHF_3$, $C_2F_6C_3F_8$, $C_4F_6$ and combinations thereof.

8. A method of manufacturing a semiconductor device comprising:

a) providing a laminated conductive structure on a substrate, the laminated conductive structure including a cap conductive sub-layer made of a material selected from the group consisting of titanium and titanium compound;

b) forming an insulating layer over the laminated conductive structure;

c) dry-etching the insulating layer in an ambient including fluorine through a mask pattern to provide a hole therein until the cap conductive sub-layer is exposed;

d) rinsing the substrate in a liquid made of a material selected from the group consisting of water, alcohol, pyridine, and combinations thereof to remove a fluoride which is formed by the fluorine reacting with a substance included in the laminated conductive structure to thereby suppress a crown; and e) removing the mask pattern from the substrate in a plasma after said step d).

9. The method according to claim 8, wherein the etching is performed through a resist mask pattern.

10. The method according to claim 8, wherein said rinsing includes rinsing the substrate in the liquid by applying ultrasonic vibrations to the liquid.

11. The method according to claim 8, wherein said rinsing uses water cooled to a room temperature or lower.

12. The method according to claim 8, wherein said etching includes performing isotropic etching and thereafter performing anisotropic etching.

13. The method according to claim 8, wherein the ambient including fluorine is a gas made of a material selected from the group consisting of $CH_2F_2$, $CF_4$, $CHF_3$, $C_2F_6C_3F_8$, $C_4F_8$ and combinations thereof.

14. A method of manufacturing a semiconductor device comprising:

a) providing a laminated conductive structure on a substrate, the laminated conductive structure including a first conductive sub-layer, a second conductive sub-layer formed on the first conductive sub-layer, and a third conductive sub-layer which is formed on the second conductive sub-layer and is made of a material selected from a group consisting of titanium and titanium compound;

b) forming an insulating layer over the laminated conductive structure;

c) etching the insulating layer through a mask pattern to provide a hole therein until the third conductive sub-layer is exposed; and d) rinsing the substrate with water and thereafter rinsing the substrate with alcohol or pyridine.

15. A method of manufacturing a semiconductor device comprising:

a) providing a laminated conductive structure on a substrate, the laminated conductive structure including a first conductive sub-layer, a second conductive sub-layer formed on the first conductive sub-layer, and a third conductive sub-layer which is formed on the second conductive sub-layer and is made of a material selected from a group consisting of titanium and titanium compound;

b) forming an insulating layer over the laminated conductive structure;

c) etching the insulating layer through a mask pattern to provide a hole therein until the third conductive sub-layer is exposed;

d) rinsing the substrate in a liquid made of a material selected from the group consisting of water, alcohol, pyridine, and combinations thereof;

e) removing the mask pattern from the substrate in a plasma; and f) washing the substrate with a liquid of organic solvent.

16. A method of manufacturing a semiconductor device comprising:

a) providing a laminated conductive structure on a substrate, the laminated conductive structure including a cap conductive sub-layer made of a material selected from the group consisting of titanium and titanium compound;

b) forming an insulating layer over the laminated conductive structure;

c) dry-etching the insulating layer in an ambient including fluorine through a mask pattern to provide a hole therein until the cap conductive sub-layer is exposed; and d) rinsing the substrate with water and thereafter rinsing the substrate with alcohol or pyridine to remove a compound which may be generated by reacting fluorine in the ambient of the dry-etching with a substance included in the laminated conductive structure to thereby suppress a crown.

17. A method of manufacturing a semiconductor device comprising:

a) providing a laminated conductive structure on a substrate, the laminated conductive structure including a cap conductive sub-layer made of a material selected from the group consisting of titanium and titanium compound;

b) forming an insulating layer over the laminated conductive structure;

c) dry-etching the insulating layer in an ambient including fluorine through a mask pattern to provide a hole therein until the cap conductive sub-layer is exposed;

d) rinsing the substrate in a liquid made of a material selected from the group consisting of water, alcohol, pyridine, and combinations thereof to remove a compound which may be generated by reacting fluorine in the ambient of the dry-etching with a substance included in the laminated conductive structure to thereby suppress a crown;

e) removing the mask pattern from the substrate in a plasma; and f) washing the substrate with a liquid of organic solvent.

* * * * *